(12) United States Patent
Tseng

(10) Patent No.: US 7,129,144 B2
(45) Date of Patent: Oct. 31, 2006

(54) OVERVOLTAGE PROTECTION DEVICE AND MANUFACTURING PROCESS FOR THE SAME

(75) Inventor: Ching Chiu Tseng, Keelung (TW)

(73) Assignee: Lite-On Semiconductor Corp., Taipei (TW)

( * ) Notice: Subject to any disclaimer, the term of this patent is extended or adjusted under 35 U.S.C. 154(b) by 0 days.

(21) Appl. No.: 10/834,840

(22) Filed: Apr. 30, 2004

(65) Prior Publication Data

US 2005/0245006 A1 Nov. 3, 2005

(51) Int. Cl.
*H01L 21/331* (2006.01)

(52) U.S. Cl. ...................... 438/309; 257/355
(58) Field of Classification Search ............... 438/199, 438/200, 234, 309; 257/355–358, 360
See application file for complete search history.

(56) References Cited

U.S. PATENT DOCUMENTS

| 4,967,256 | A | | 10/1990 | Pathak et al. | |
|---|---|---|---|---|---|
| 5,001,537 | A | | 3/1991 | Colman et al. | |
| 5,516,705 | A | * | 5/1996 | Webb et al. | 438/133 |
| 5,981,322 | A | * | 11/1999 | Keeth et al. | 438/199 |
| 6,372,590 | B1 | * | 4/2002 | Nayak et al. | 438/305 |

* cited by examiner

*Primary Examiner*—David Vu
(74) *Attorney, Agent, or Firm*—Birch, Stewart, Kolasch & Birch, LLP

(57) ABSTRACT

An overvoltage protection device has a voltage-limiting region parallel to its central junction to produce a transverse junction breakdown. The spacing between the voltage-limiting region and the central junction defines the breakdown voltage. Via varying the size and location of the voltage-limiting region, the protection device can has various-breakdown voltages and lower breakover currents. Thereby, the sensitivity of the protection device can be improved.

8 Claims, 7 Drawing Sheets

OVERVOLTAGE PROTECTION DEVICE AND MANUFACTURING PROCESS FOR THE SAME

FIELD OF THE INVENTION

The present invention is directed to an overvoltage protection device and manufacturing process for the same, and more particularly, to an overvoltage protection device having a voltage-limiting region disposed on a central contacting surface thereof for defining the breakdown voltage and breakover current. Thereby, the present invention can make the overvoltage protection device capable of adjusting the breakdown voltage and breakover current.

BACKGROUND OF THE INVENTION

Recently, the manufacturing processes for electronic components are more and more precise and their sizes also have become smaller and smaller. Hence, the devices used to protect electronic components from the damage resulting from electric effects, such as static electricity, overvoltage, electric arc and so on, also become more and more important. For instance, the thyristor overvoltage protection devices are used in the modern communication systems extensively. These devices are used to protect the communication system from the damage resulting from lighting strikes on transmission lines, short circuits of neighboring power lines or other unexpected events. These devices can prevent any damage resulting from the overvoltage effects.

The thyristor overvoltage protection device is a semiconductor device designed to lead the overvoltage surge away from the transmission line before it reaches the communication system. Hence, it can be used to protect the communication system. When the system operates regularly, this protection device is kept in a high-resistance status, i.e. in an off status. At this moment, only the leakage current, which is lower than a microampere, can pass through this device. Hence, it won't affect the operation of the whole system. When an overvoltage surge occurs on the transmission lines, this device will switch to a low-resistance status, i.e. an on status. Thereby, this device can lead the overvoltage surge away from the communication system. After the overvoltage surge passes away, the overvoltage protection device will switch back to the off status and the communication system will return to regular operations.

The characteristics of the current and voltage of this overvoltage protection device are shown in FIG. 1, which is a curve diagram of the voltage (V) versus the current (I) of the conventional overvoltage protection device.

In general, the thyristor overvoltage protection device has two metal electrodes and a four-layer interleaving semiconductor structure, for example, which is interleaved by NPNP-type or PNPN-type layers. The top layer of this protection device is an emitter region, i.e. the cathode region; the second layer is a base region; the third layer is a substrate region; and the fourth layer is an anode region. Therein, the two metal electrodes are disposed on the surfaces of the emitter region and the anode region, respectively.

The junction between the base region and the substrate region is the central junction of this protection device. Under regular operation, the central junction will be reverse biased. When the reverse bias increases, the central junction will breakdown. As shown in the figure, when the breakdown current reaches 1 mA, the voltage across the protection device is defined as the breakdown voltage (Vz). If the voltage increases constantly at this moment, the breakdown current will increase rapidly and make the protection device switch to the on status. The voltage and current for making the protection switch to the on status are defined as the breakover voltage (VBO) and the breakover current (IBO). When the overvoltage surge occurs and reaches the breakover voltage (VBO), the overvoltage protection device will turn on to lead the induced current through the protection device and keep the voltage across the protection device in a relatively low value. When the overvoltage surge passes away, the current passing through the protection device will decrease constantly. When the current is lower than the holding current (IH) of the protection device, the overvoltage protection device will switch back to the off status (as shown in the figure) to make the voltage across the protection device return to normal and make the communication system operate regularly.

Reference is made to FIG. 2, which is a schematic diagram of a overvoltage protection device disclosed in U.S. Pat. No. 4,967,256. The thyristor overvoltage protection device has a four-layer semiconductor structure (PNPN), including emitter regions 22 (n++), shorting dots 23 disposed between the emitter regions 22, a substrate 20, a single buried region 25 (n) disposed inside the substrate 20, a base region 21 (p+), an anode region 24, a first metal electrode region 26 connected with the upper components, a second metal electrode region 27 connected with the lower components and a guard ring 28 (n++) surrounding the central junction. The guard ring 28 is used to make the potential difference of the component surface evenly distributed to improve the stability of the whole device. Further, the guard ring 28 won't result in the breakdown of this semiconductor device.

As shown in FIG. 2, the buried region 25 and the substrate 20 both are N-type semiconductors, but the buried region 25 has a higher impurity concentration. The breakdown voltage of the junction between the buried region 25 and the substrate 20 is lower than that between the base region 21 and the substrate 20. Hence, when the voltage across the protection device increases, the breakdown effect will first occur at the junction between the base region 21 and the buried region 25 and make the breakdown current pass through the buried region 25 first. This effect can improve the precision for controlling the breakdown voltage during manufacturing process of the device. Further, it can make this device have a breakover current even lower than that of the traditional device without the buried region.

However, in application, this overvoltage protection device still has drawbacks. Since it employs a single buried region with relative small size, its conductivity will be limited during the on status. Hence, it will cause a bottleneck effect, which will lower the current carrying capacity of the device. In order to prevent the bottleneck effect, U.S. Pat. No. 5,001,537 and No. 5,516,705 disclose two kinds of overvoltage protection devices employing multiple buried regions. However, since the operation principle of the devices is still unchanged, i.e., as described above, controlling the breakdown voltage and breakover current via employing the effect that the junction between the base region and the buried region will breakdown first, which is different to the present invention.

Accordingly, the present invention disposes a voltage-limiting region parallel to the central junction of the overvoltage protection device during the manufacturing process of the semiconductor device for defining the breakdown voltage and the breakover current of the device. Thereby, the present invention can provide a precise overvoltage protection device. Since it doesn't have the buried region, it can have the higher current carrying capacity.

SUMMARY OF THE INVENTION

An objective of the present invention is to provide an overvoltage protection device and manufacturing process for the same. The present invention disposes a voltage-limiting region parallel to a central junction of the protection device to make the protection device able to produce a transverse junction breakdown. The voltage-limiting region can be used to define the breakdown voltage and breakover current of the protection device. Via varying the size and location of the voltage-limiting region, the sensitivity of the protection device for the overvoltage surge can be improved considerably.

Furthermore, the manufacturing process of the present invention forms a first shading layer on a substrate, etches the first shading layer to form a plurality of shading blocks to define a first region and a second region, forms the base region in the second region, forms the voltage-limiting region in the first region; forms an emitter region on the base region, and forms an electrode region on the emitter region.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION

Figure 3:
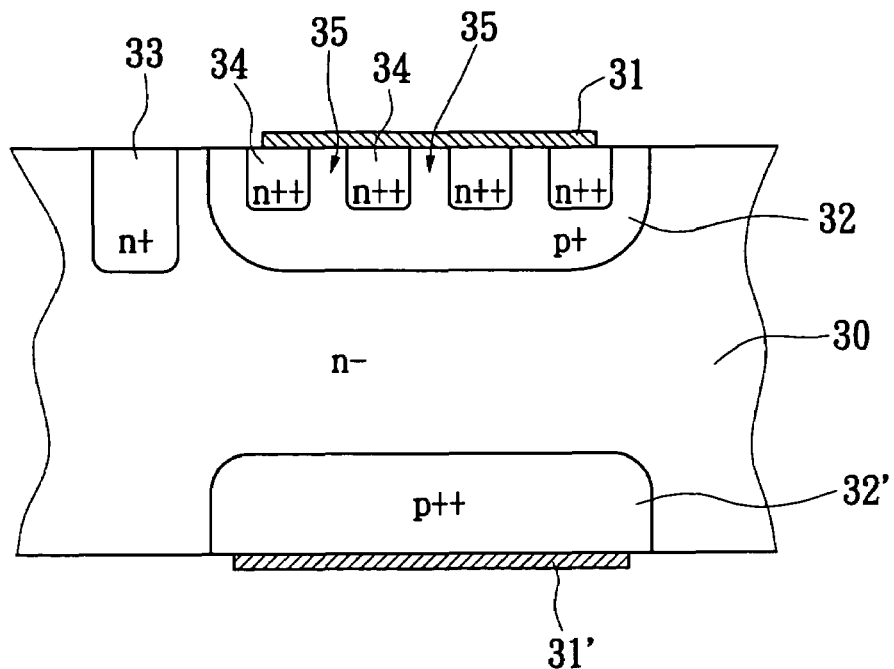
FIG. 3 is a cross-sectional diagram of an overvoltage protection device in accordance with the present invention.

Reference is made to FIG. 3, which is a cross-sectional diagram of an overvoltage protection device in accordance with the present invention. As does the prior art, it also has a four-layer interleaving semiconductor structure (PNPN). Therein, a P-type base region 32, which has a relatively high impurity concentration (p+), is disposed on an N-type substrate 30, which has a relatively low impurity concentration (n−). An anode region 32' is disposed on the other side of the device. The base region 32 has emitter regions 34 disposed thereon. The emitter regions 34 have a high impurity concentration and have multiple emitter shorting dots 35 formed therebetween. The PN junction between the base region 32 and the substrate 30 is the central junction of the protection device.

The present invention further disposes a voltage-limiting region 33, which is shaped as a ring, a partial ring or segmented pieces and has higher impurity concentration (n+), parallel to the central junction. Further, the protection device has a first electrode region 31 and a second electrode region 31' disposed on its upper and lower surfaces, respectively.

The voltage-limiting region 33 is made of an N-type semiconductor with a relatively high impurity concentration. Since its impurity concentration is higher than that of the substrate 30, the transverse breakdown voltage of the base region 32 is lower than the PN junction located between the lower portion of the base region 32 and the substrate 30. Hence, the breakdown voltage of the protection device is primarily determined according to the spacing between the base region 32 (p+) and the voltage-limiting region 33. The larger the spacing is, the higher the breakdown voltage is that can be obtained. Conversely, the smaller the spacing is, the lower the breakdown voltage is that can be obtained. In practical application, the breakdown voltage can be changed via adjusting the spacing between the voltage-limiting region 33 and the base region 32 according to practical needs.

Figure 1:
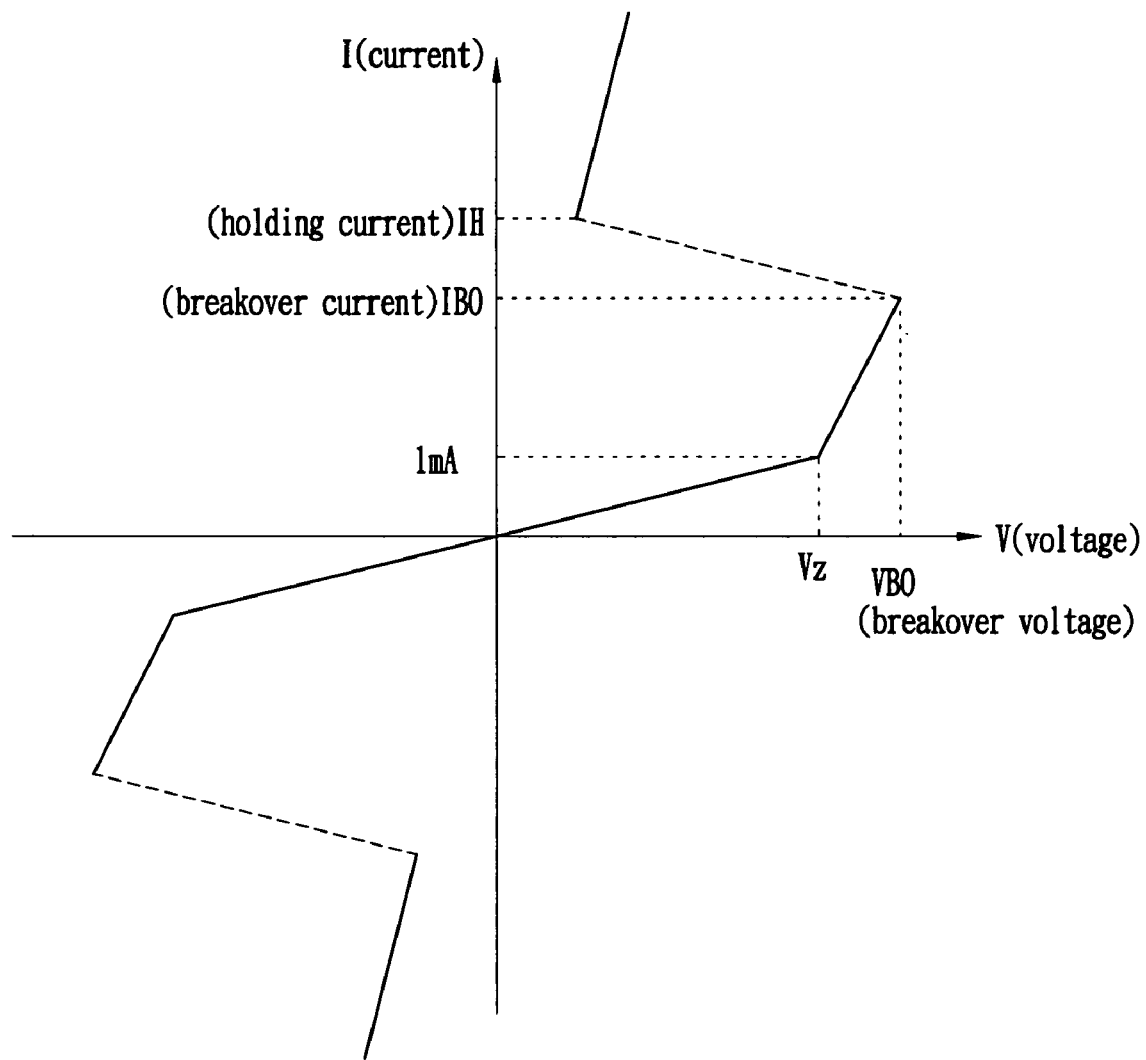
FIG. 1 is a curve diagram of the voltage (V) versus the current (I) of the conventional overvoltage protection device.
Figure 2:
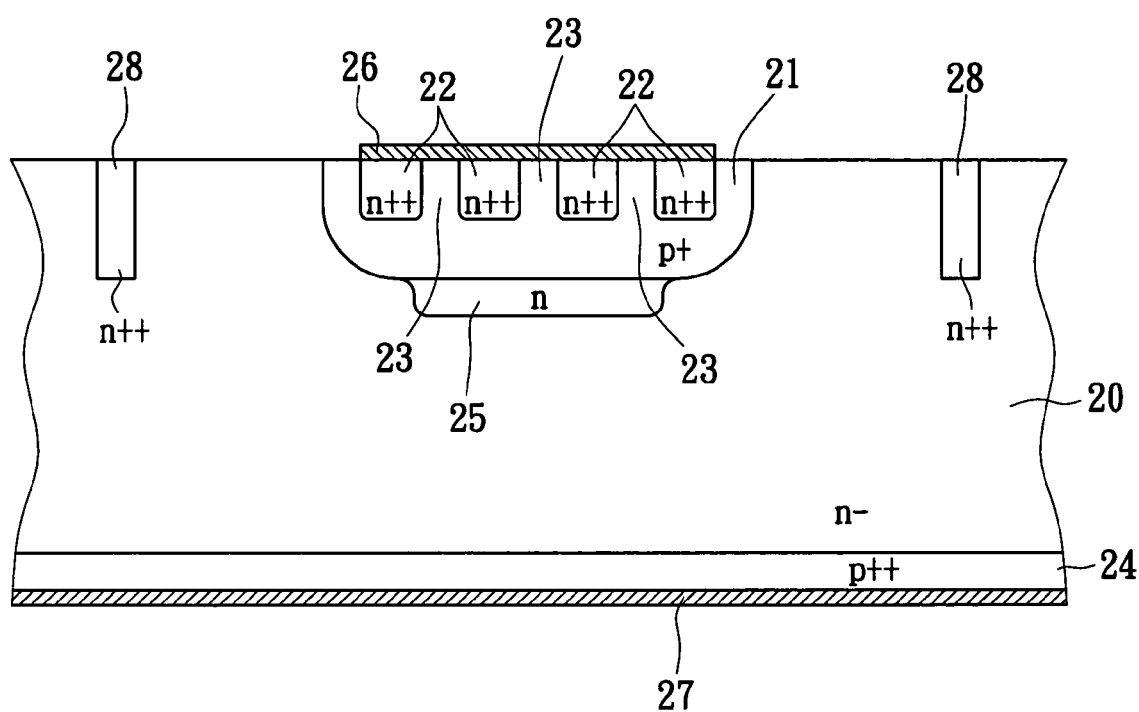
FIG. 2 is a schematic diagram of a overvoltage protection device disclosed in U.S. Pat. No. 4,967,256.

As shown in FIG. 3, the voltage-limiting region 33 is disposed on one side of the base region 32. In practice, it is not limited. The total length of the voltage-limiting region 33 can be used to determine the breakover current of the overvoltage protection device. In other words, a breakdown region is formed between the voltage-limiting region 33 and the base region 32 and the breakdown current can only pass through this region. When the breakdown phenomenon occurs, the total length of the voltage-limiting region 33 will dominate the size of the breakdown region and control the amount of the breakdown current passing through this breakdown region. Therein, if the length of the voltage-limiting region 33 is short, the breakdown region will be small and the breakdown current will be low. As shown in FIG. 1, when the protection device is switched to the on status, the breakdown current is defined as the breakover current (IBO) of the protection device. Hence, using the voltage-limiting region 33 with short length can lower the breakover current (IBO) effectively. Further, since the breakover current for switching the protection device to on status is lowered, an overvoltage protection device sensitive to the overvoltage can be obtained. Therein, the preferred embodiments are described as follows.

Figure 4A:
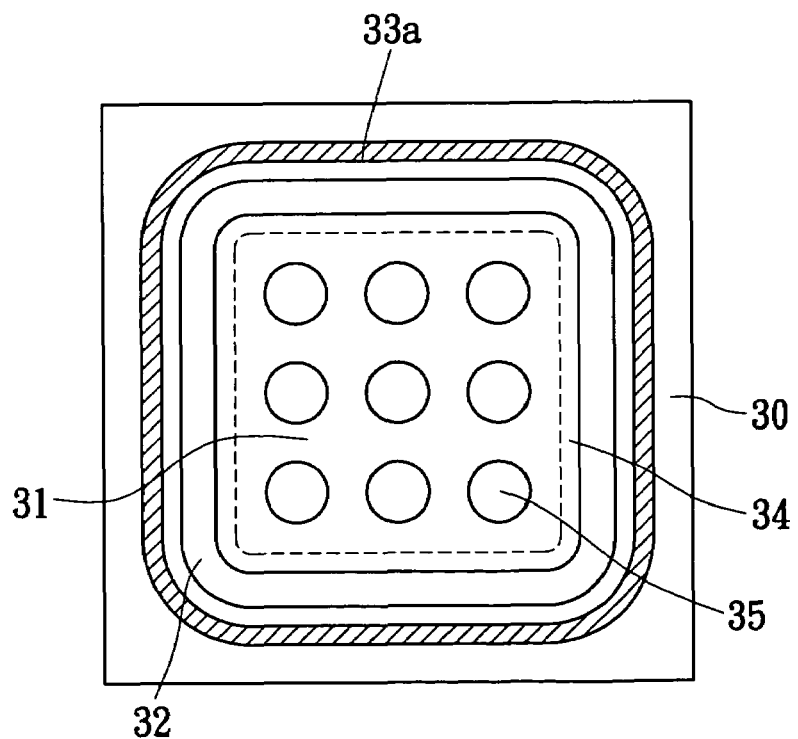
FIG. 4a is a top-view diagram of the first embodiment of the overvoltage protection device in accordance with the present invention.

Reference is made to FIG. 4A, which is a top-view diagram of the first embodiment of the overvoltage protection device in accordance with the present invention. The upper portion of the semiconductor substrate 30 is surrounded by a circular voltage-limiting region 33a made of an N-type semiconductor. There is a gap located between the voltage-limiting region 33a and the base region 32 made of a P-type semiconductor. The emitter region 34 is disposed inside the base region 32. The multiple holes shown in the figure are emitter shorting dots 35. The emitter region 34 has a first electrode region 31 disposed thereon. In general, the first electrode region 31 is a metal layer used to connect with other components.

Figure 4B:
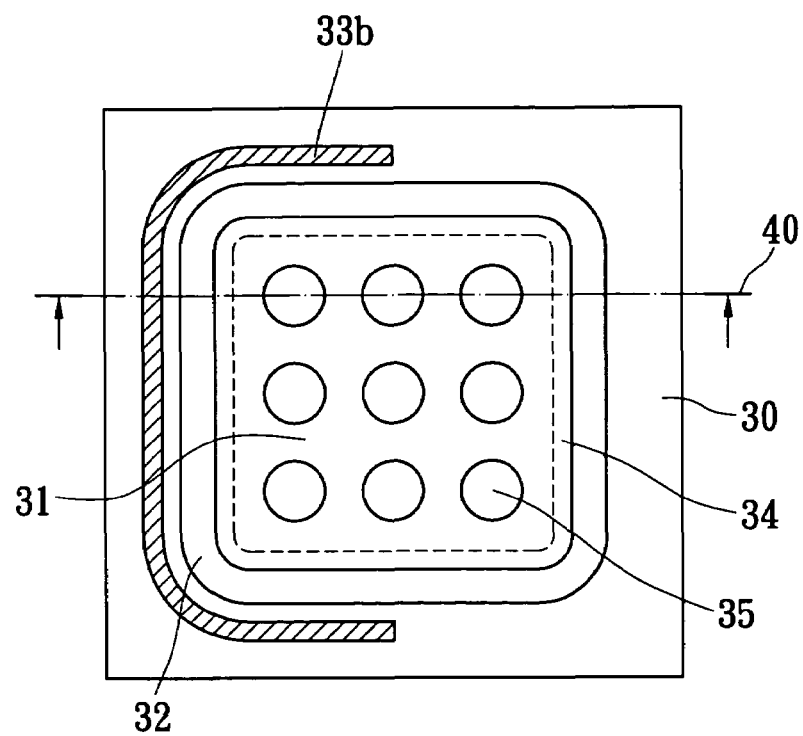
FIG. 4b is a top-view diagram of the second embodiment of the overvoltage protection device in accordance with the present invention.

Reference is made to FIG. 4B, which is a top-view diagram of the second embodiment of the overvoltage protection device in accordance with the present invention. The hatching 40 shown in this figure corresponds to the cutaway view shown in FIG. 3. The components of the present invention can be modified according to the practical requirements.

Therein, the upper portion of the semiconductor substrate 30 is surrounded by a semicircular voltage-limiting region 33b made of an N-type semiconductor. There is a gap located between the voltage-limiting region 33b and the base region 32 made of a P-type semiconductor. The emitter region 34 is disposed inside the base region 32 and has the multiple emitter shorting dots 35. The emitter region 34 has the first electrode region 31 disposed thereon.

Figure 4C:
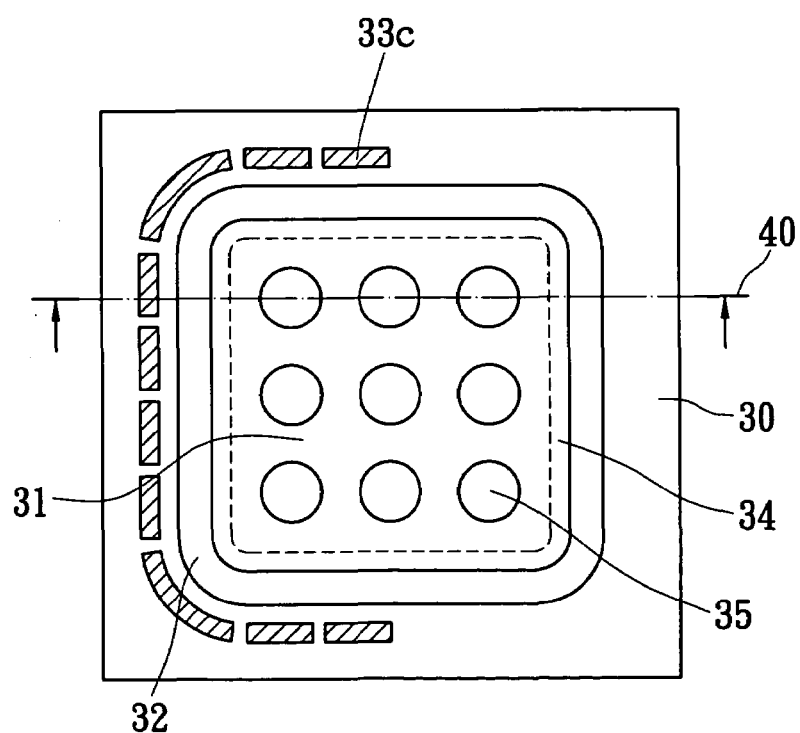
FIG. 4c is a top-view diagram of the third embodiment of the overvoltage protection device in accordance with the present invention.

Reference is made to FIG. 4C, which is a top-view diagram of the third embodiment of the overvoltage protection device in accordance with the present invention. The hatching 40 shown in this figure corresponds to the cutaway view shown in FIG. 3. The present invention can be modified according to the practical requirements.

Therein, the upper portion of the semiconductor substrate 30 is surrounded by a semicircular segmented voltage-limiting region 33c made of an N-type semiconductor. There is a gap located between the voltage-limiting region 33c and the base region 32 made of a P-type semiconductor. The emitter region 34 is disposed inside the base region 32 and has the multiple emitter shorting dots 35. The emitter region 34 has the first electrode region 31 disposed thereon.

Taking FIG. 4C as an example, using segmented voltage-limiting region not only can reduce the total length of this voltage-limiting region but also can equally distribute the breakdown phenomenon to a longer length around the device. Hence, it can lower the breakover current and increase the power dissipation capacity to increase the stability of the device.

Figure 5:
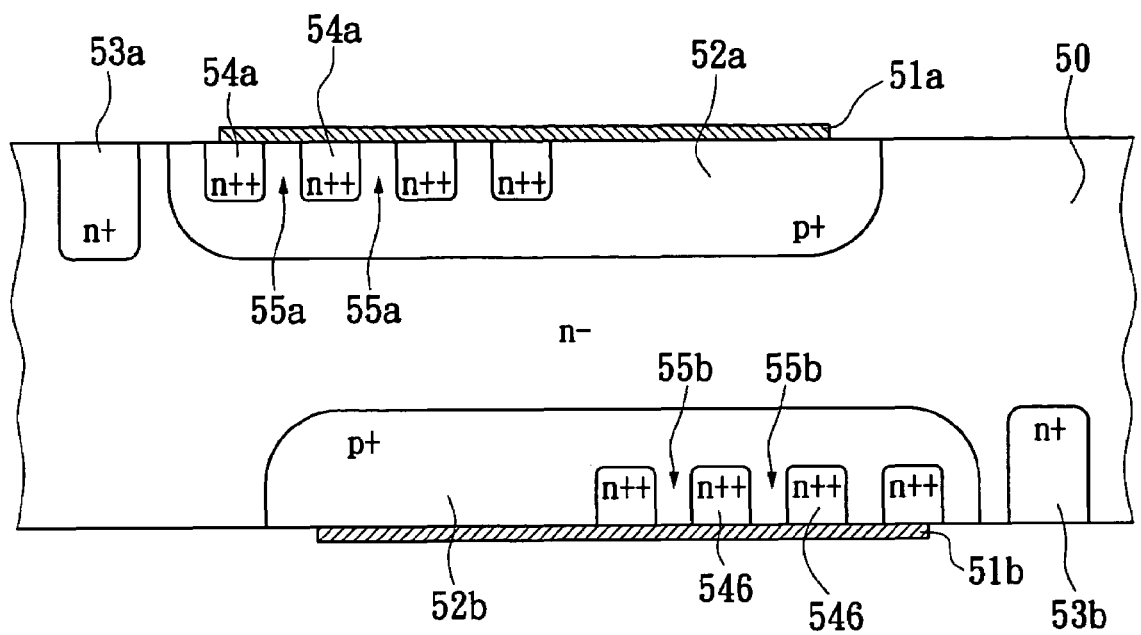
FIG. 5 is a schematic diagram of a bi-directional overvoltage protection device in accordance with the present invention.

Reference is made to FIG. 5, which is a schematic diagram of a bi-directional overvoltage protection device in accordance with the present invention. Therein, the two opposed sides of the substrate 50 both have a overvoltage protection device, including a first and second base regions 52a, 52b made of P-type semiconductors, a first and second voltage-limiting regions 53a, 53b disposed at the two sides, a first and second emitter regions 54a, 54b respectively disposed on the base regions, multiple first and second emitter shorting dots 55a, 55b formed inside the emitter regions, and a first and second electrode regions 51a, 51b disposed at the two surfaces of the device. The overvoltage protection device shown in FIG. 3 is a uni-directional device, which only has unidirectional overvoltage protection functions. However, the bi-directional overvoltage protection device shown in FIG. 5 can provide bi-directional protection functions for the communication systems operated under alternative voltages.

Reference is made to FIGS. 6a–f, which illustrate a manufacturing process of the overvoltage protection device in accordance with the present invention. This manufacturing process is used to produce the uni-directional protection device. As for the bi-directional or multi-directional devices, they can also be produced according to this process.

Figure 6A:
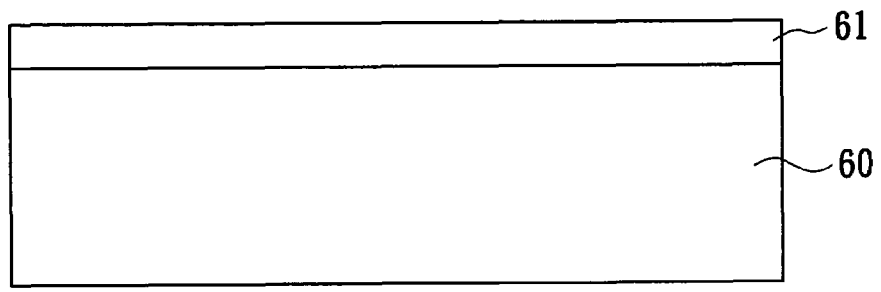
FIGS. 6a–6f illustrate a manufacturing process of the overvoltage protection device in accordance with the present invention.

As shown in FIG. 6a, a first shading layer 61 is formed on a substrate 60 via oxidation or deposition process. The substrate 60 is mainly made of silicon (Si) and the first shading layer 61 can be made of SiO2 or other membranous layer (e.g. Si3N4).

Figure 6B:
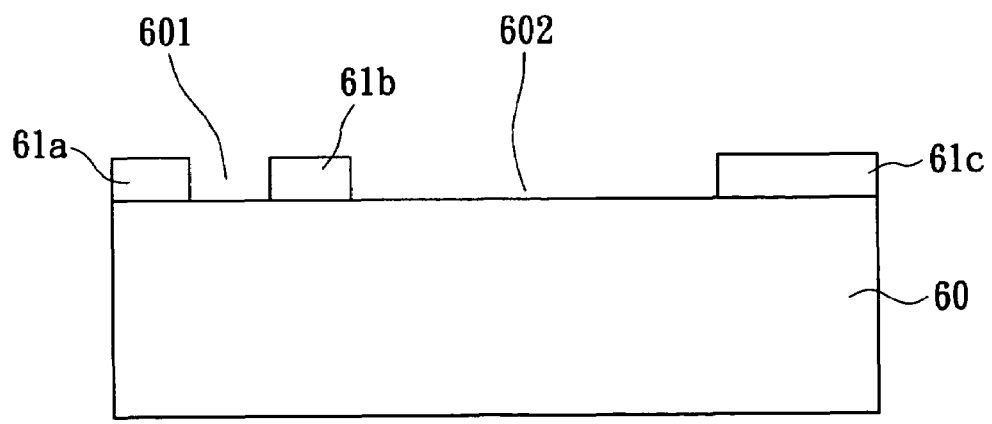

As shown in FIG. 6b, via lithography and etching processes, the first shading layer 61 can be etched to form the shading blocks 61a, 61b, 61c and multiple regions as shown in FIG. 6b. Therein, the first region 601, which will become the voltage-limiting region, is defined between the shading blocks 61a and 61b. The second region 602, which will become the base region, is defined between the shading blocks 61b and 61c. The width of the shading block 61b is the spacing of the first region 601 (voltage-limiting region) and the second region 602 (base region) and used to determine the breakdown voltage value of this device.

Figure 6C:
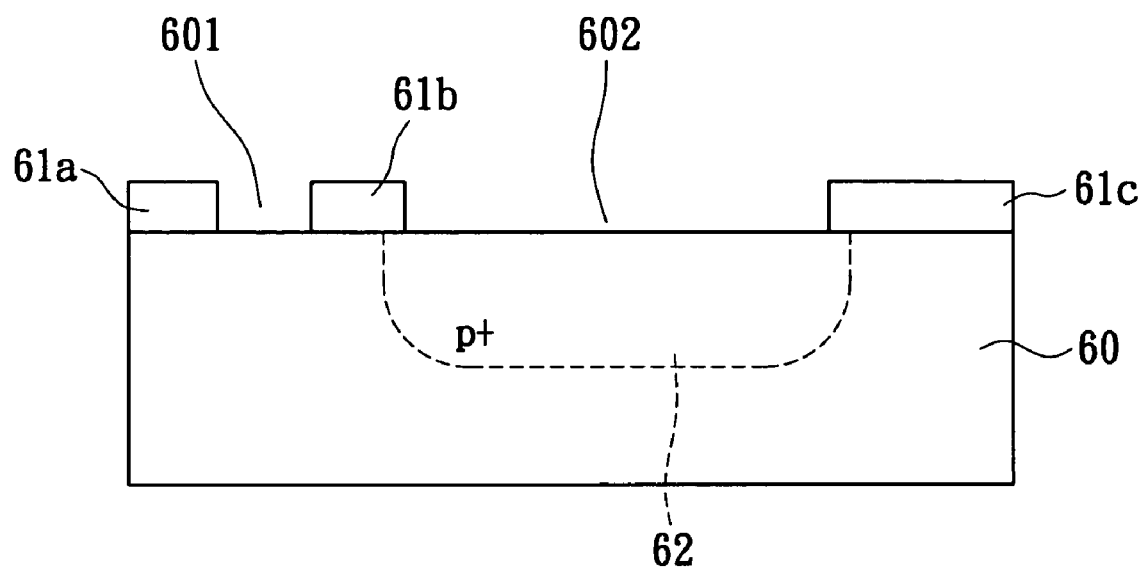

As shown in FIG. 6c, a selected diffusion process or ion implantation process is used to diffuse or implant the impurity atoms into the second region 602 to form the base region 62 of the device, i.e. the P-type semiconductor region shown in the figure.

Figure 6D:
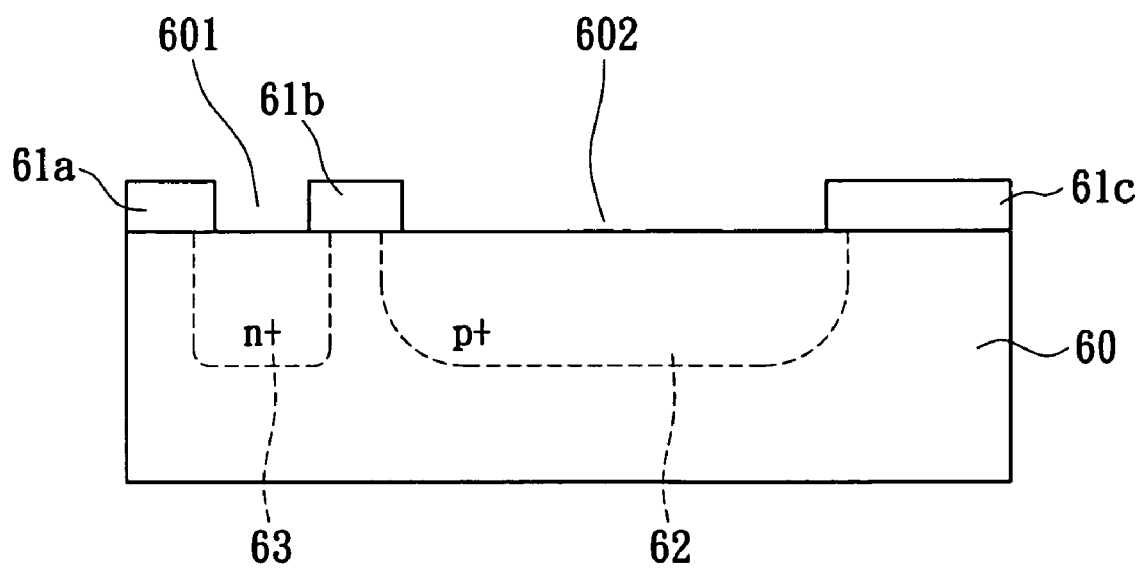

As shown in FIG. 6d, the selected diffusion process or ion implantation process is also used to diffuse or implant the impurity atoms into the first region 601 to form the voltage-limiting region 63 of the present invention.

Figure 6E:
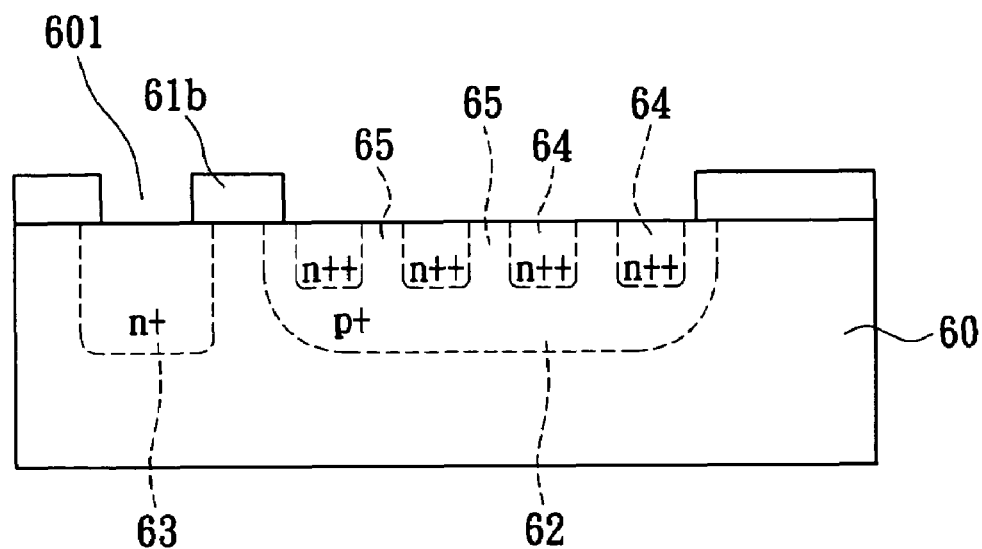

As shown in FIG. 6e, the selected diffusion process or ion implantation process is also used to diffuse or implant high-concentration impurity atoms into the base region 62 to form the high-concentration emitter region 64 and the emitter shorting dots 65.

Figure 6F:
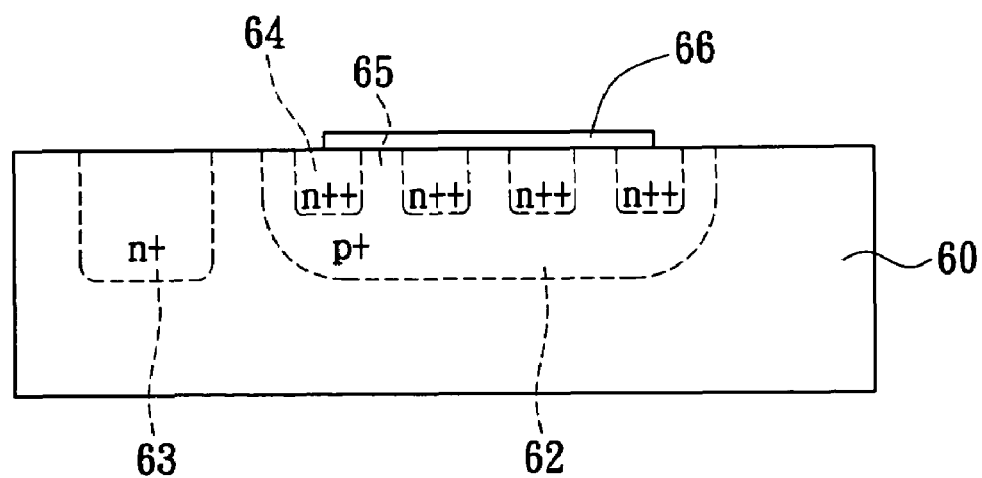

As shown in FIG. 6f, finally, a metal layer is deposited on the emitter region 64 as an electrode region 66 for electric conduction. And the manufacturing process of the protection device is ended at this step.

Furthermore, in FIG. 6e mentioned above, the step for forming the emitter region can also be performed right after the base region is formed. The present invention is not limited to the manufacturing order described above. The steps described above can also be repeated or performed simultaneously on the two sides of the substrate to manufacture the bi-directional or multi-directional overvoltage protection device.

The present invention disposes a voltage-limiting region parallel to the central junction of the overvoltage protection device. Via varying the size and location of the voltage-limiting region, the present invention can define the breakdown voltage and breakover current so as to produce an overvoltage protection device sensitive to the overvoltage phenomenon.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A method for manufacturing an overvoltage protection device, wherein a voltage-limiting region surrounds a base region of the overvoltage protection device to control a breakdown voltage and a breakover current, the method comprising:

forming a first shading layer on a substrate;

etching the first shading layer to form a plurality of shading blocks to define a first region and a second region;

forming the base region in the second region;

forming the voltage-limiting region in the first region, wherein a breakdown region is formed between the voltage-limiting region and the base region and the breakover current passes through the breakdown region;

forming an emitter region on the base region; and forming an electrode region on the emitter region;

whereby, the breakdown voltage is determined according to the spacing between the base region and the voltage-limiting region.

2. The method as claimed in claim 1, wherein the voltage-limiting region has a first impurity concentration larger than a second impurity concentration of the substrate.

3. The method as claimed in claim 1, wherein the voltage-limiting region and the base region produce a transverse breakdown phenomenon therebetween.

4. The method as claimed in claim 1, wherein the base region is completely or partially surrounded by the voltage-limiting region with a continuous shape or a segmented shape.

5. The method as claimed in claim 1, wherein the step for forming the base region, the voltage-limiting region or emitter region is performed via a diffusion process or an ion implantation process.

6. The method as claimed in claim 1, wherein the substrate, the voltage-limiting region or the emitter region is made of an N-type semiconductor and the base region is made of a P-type semiconductor.

7. The method as claimed in claim 1, wherein the voltage-limiting region or the emitter region is made of a P-type semiconductor and the base region is made of an N-type semiconductor.

8. The method as claimed in claim 1, wherein a structure of the overvoltage protection device is manufactured repeatedly to form a bi-directional or multi-directional overvoltage protection device.

* * * * *